(12) United States Patent
Amin et al.

(10) Patent No.: US 7,724,359 B2
(45) Date of Patent: May 25, 2010

(54) METHOD OF MAKING ELECTRONIC ENTITIES

(75) Inventors: Ahmed Nur Amin, Fairfax, VA (US); Mark Adam Bachman, Sinking Spring, PA (US); Frank A. Baiocchi, Allentown, PA (US); John Michael DeLucca, Wayne, PA (US); John William Osenbach, Kutztown, PA (US)

(73) Assignee: Agere Systems Inc., Allentown, PA (US)

( * ) Notice: Subject to any disclaimer, the term of this patent is extended or adjusted under 35 U.S.C. 154(b) by 22 days.

(21) Appl. No.: 12/154,794

(22) Filed: May 27, 2008

(65) Prior Publication Data

US 2009/0298286 A1 Dec. 3, 2009

(51) Int. Cl.
 *G01N 21/00* (2006.01)
(52) U.S. Cl. ............... 356/237.3; 356/237.1; 356/237.6
(58) Field of Classification Search .... 356/237.1–237.6
See application file for complete search history.

(56) References Cited

U.S. PATENT DOCUMENTS

2004/0126708 A1 * 7/2004 Jing et al. ................. 430/320
2005/0139644 A1 * 6/2005 Brese et al. .............. 228/248.1

* cited by examiner

*Primary Examiner*—Gregory J Toatley, Jr.
*Assistant Examiner*—Iyabo S Alli
(74) *Attorney, Agent, or Firm*—Mendelsohn, Drucker & Associates, P.C.; Steve Mendelsohn

(57) ABSTRACT

Many electronic entities such as integrated circuits and discrete power devices have contact pads formed from successively deposited layers of nickel and a second metal such as gold. The resulting pad structure is used to make external electrical connection such as solder connection. Problems associated with failure of such connections are avoidable by inspecting the surface of the nickel layer for excessive small particle formation.

14 Claims, 2 Drawing Sheets

METHOD OF MAKING ELECTRONIC ENTITIES

TECHNICAL FIELD

This invention relates to electrical connection and in particular to electrical connection to electrically conducting pads of an electronic device and other electrical structures.

BACKGROUND OF THE INVENTION

Electronic devices such as integrated circuits and discrete power devices generally have metal regions externally accessible to facilitate electrical contact. Similarly, electrical interconnect structures such as printed circuit boards have regions at which electrical connection to a second electronic entity is formed. (Electronic devices and electrical interconnect structures as well as other structures having conducting pads for electrical connection are generically denominated for purposes of this disclosure electronic entities.) In such structures the interconnection regions are typically denominated pads and are generally formed from metals such as aluminum, copper, nickel, gold, palladium, silver, and tin. The thickness and composition of the metal layers are dependent upon 1) the intended application, 2) the method used to create the contact, and 3) the final interconnect structure. For example, lead frame packages use aluminum pads on integrated circuits and silver coated copper pads on the lead frame itself. Correspondingly, aluminum integrated circuit pad thicknesses are generally in the range 0.6 to 1.5 µm and silver package lead thicknesses in the range 4 to 10 µm. Substrate based packages used for wire bonded integrated circuits have copper substrate pads that are coated with electrolytic nickel/gold, electroless nickel/immersion gold (ENIG), or electroless nickel/electroless palladium/immersion gold (ENEPIG). Substrate based packages for flip chip integrated circuits have copper pads that are coated with immersion tin, solder, ENIG or ENEPIG. Similarly, the pad surface area for these different metallization layers is dependent upon the design and generally range from 50 µm² to 1 mm².

A variety of techniques relying on introduction of a metal to the pad, e.g. soldering, is employed to produce an electrically conducting region that adheres to the pad and to the entity being connected to the pad. Such interconnect formation requires an electrically conducting interface between the pad and the electronic structure that is mechanically sound and that typically has a resistivity (including the resistance of the interfaces) of no greater than 2 to 5µ ohms.

Extensive research has centered on forming suitable interconnects. As previously discussed, one commonly used interconnect resulting from such research involves the formation of a nickel region overlying the pad with subsequent formation of a noble metal such as gold, in turn, overlying the nickel. The gold is employed because it is not easily oxidized and thus provides excellent electrical conduction. However, typical pad materials such as copper diffuse rapidly through gold with subsequent production of oxides such as copper oxide at the surface to be soldered. Such oxides make soldering difficult and tend to degrade electrical conductivity at the interface. To avoid diffusion resulting in oxide formation, nickel, as discussed above, is employed as an intermediary barrier layer between the pad materials such as copper and the noble metal such as gold. The nickel itself is not acceptable without the overlying noble metal since without such overlying region, it forms oxides that preclude reliable and acceptable solder adhesion.

Electrolytic plating processes are commonly used in nickel/gold stacked layer structures in some applications such as wire bonded ball grid array packages. However, in other applications such as flip chip ball grid array packages electrolytic processes have been found undesirable for plating the nickel and gold regions overlying the pad. It is impractical to make the requisite electrical connection for plating to each flip chip pad without incurring excessive costs or unduly limiting the number of pads present. Additionally, even if such connection could be made, it is even more difficult to maintain a uniform current density over all pads and thus to uniformly and precisely control the plated metal thickness. Such non-uniformities and lack of thickness control either degrades the ultimate device properties due to phenomenon such as gold embrittlement of the solder joint or leads to additional costs associated with the necessity to increase gold thickness to ensure adequate joint formation. Accordingly electroless plating procedures are employed for forming both the nickel region on the pad and the overlying noble metal region. Electroless processes such as described in *Electroless Nickel Plating*, W. Reidel, ASM International, Metals Park, Ohio, 1988 provide an alternative to electroplating for metals including nickel, gold, silver, palladium, tin as well as other metals such as copper. Accordingly, it is possible to form such metals in thin continuous and uniform regions.

Despite the excellent characteristics of the ENIG and ENEPIG structures some problems have been persistent. In particular, at what appears to be random instances, subsequent soldering of the ENIG and ENEPIG structures leads to poor adhesion between the pad and the solder layer resulting in mechanical failure of the connection. This problem denominated black pad in the trade is extremely undesirable because the entire device is fabricated before the defect becomes apparent through mechanical failure of solder joints. Additionally, because failure comes after soldering and the concomitant barrier to pad inspection, it is extremely difficult to identify the root cause of the black pad defect. Because the appearance of black pad problems is unpredictable and because of the severe economic costs associated with this defect, a recognition of the cause and subsequent solution would be extremely desirable. However, despite extensive attempts such resolution has been an elusive goal.

SUMMARY OF THE INVENTION

It has been found that incipient black pad problems are identifiable before application of a soldering procedure. In particular, the presence of small defects/particles i.e. defects/particles having sizes in the range 0.05 to 1.0 µm are indicia of black pad issues. Typically, unacceptable mechanical degradation associated with black pad degradation occurs when the density of such small particles is 1) more than $10^{-3}$ small particles per µm² for a pad with area of 10,000 µm² or less or 2) for a pad with an area of more than 10,000 µm² more than 10 small particles for any 10,000 µm² pad region. (In the context of this invention, a small particle density that exceeds the levels of criterion 1) or 2) is denominated an unacceptable small particle density. If neither criterion 1) nor 2) is satisfied the small particle density, for purposes of this invention, is considered acceptable. Pad area for purposes of criteria 1) and 2) is the area of a plane that terminates at the boundaries of the pad and that is a least square fit for the surface of such pad.)

Although the exact atomistic mechanism of degradation associated with such particles is not fully resolved it is believed that small particles of phosphorus doped nickel are formed when electroless plating conditions are not carefully controlled. That is, when filtering of particles is inadequate or when other conditions conducive to nickel particle formation in the electroless bath are present, such particles are incorporated on the surface of the nickel being plated and act as nucleation points for the subsequent nickel growth. Because growth from the particle proceeds differently from growth initiated by the bulk surface, in effect, an interface is produced between the nickel growth from the particle and the nickel growth from the bulk. In addition to the interface, the particle also introduces local surface topology to the nickel layer. The combination of the interface and surface topology provide locations where nickel oxide tends to form during the subsequent immersion gold process. This nickel oxide in turn causes, it is believed, mechanical failure of the subsequent solder connection.

Thus in addition to the inventive identification of an indicium of black pad problems, it is further recognized as part of the invention that at least a representative sample of production lots should be inspected before soldering to determine if an unacceptable small particle density is present. Upon identification of such presence, the lot should be discarded or otherwise treated before the cost of subsequent processing is incurred. In one embodiment, a representative sample from each lot is inspected. Thus, for example, 10 percent of the devices formed in the lot are inspected for the presence of an unacceptable small particle density. Alternatively, each device of the lot is inspected and those having an unacceptable particle density are discarded or otherwise treated. By this expedient, the often disastrous consequences associated with the black pad phenomenon are substantially mitigated.

DETAILED DESCRIPTION

Figure 1:
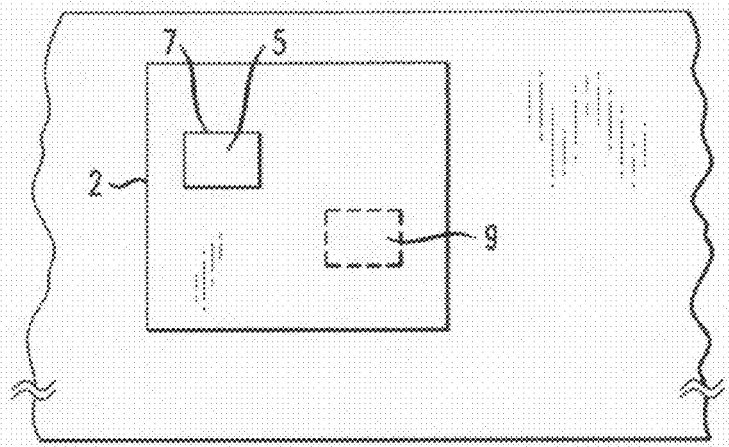
FIG. 1 is a plan view of a pad region having superimposed a region of 10,000 $\mu m^2$ for determination of particle density.

As discussed the invention involves the manufacture of electronic entities having ENIG structures. (For the purpose of this disclosure an ENIG structure is employed as a generic term encompassing a variety of structures including ENEPIG and any other structure having a copper or aluminum pad overlaid by a nickel electroless plated region which in turn is overlaid by a conducting material, e.g. a metal that is more positive on the electromotive force (EMF) scale than nickel. That is although ENIG refers specifically to a structure having gold as the top layer, the term as used for purpose of this disclosure encompasses any overlying conductive material that is deposited by a surface redox exchange reaction, i.e. the depositing material exchanges charges with the surface onto which it is being deposited such that the previously deposited metal or material ionizes and goes into solution while the depositing material is reduced. In general, such process requires that the depositing material has a more positive EMF than the material of the surface upon which it is deposited. Overlaid for purposes of this disclosure means more distant from the substrate upon which the device is constructed.) The inventive manufacturing process includes a step of choosing a sample of the device being manufactured having an electroless nickel plated region and inspecting this region for an unacceptable small particle density. The device (and if desired other devices in the same manufacturing lot) is then further treated to progress toward completion of the device if such particles in excessive density are not present. If an unacceptable small particle density is present, the device, and advantageously the entire manufacturing lot, is either treated to mitigate the associated problems or is discarded.

Typically the manufacture includes the formation of a nickel region on a conducting pad such as a copper containing pad or zincated aluminum pad. (Nickel region refers to a region that comprises at least 80 weight percent nickel e.g. doped nickel or a nickel alloy.) The nickel is deposited using an electroless plating process, for example, described in W.

Riedel supra. The nickel material is typically doped with phosphorus or boron containing entities in a concentration range 2 to 12 weight percent. The phosphorus or boron doping entity is introduced into the deposited nickel though the incorporation of a suitable amount of hypophosphate or boronhydride reducing agent employed in the electroless plating medium. The doped nickel region is then overlaid by an electroless plating of a conducting material that is higher on the EMF scale than nickel. Typical materials employed to overlay the nickel include palladium, gold, or sequential layers of palladium and gold. Conventional methods are suitably employed for depositing such metals and are described in *Fundamentals of Electrochemical Deposition*, $2^{nd}$ ed., M. Paunovic and M. Schlesinger, Wiley & Sons, New Jersey, 2006, page 162. Generally the nickel region has a thickness in the range 1 to 15 $\mu m$. Thinner layers present difficulties in maintaining a continuous region while thicker layers are not desirable because they increase joint resistance, localized stress, and cost. The conducting region overlying the nickel typically has a thickness in the range 0.1 to 1 $\mu m$. Regions thinner than 0.01 $\mu m$ generally do not provide adequate adhesion for subsequent processing such as soldering while regions thicker than 1 $\mu m$ although not precluded are uneconomic.

After the formation of the nickel region but before the formation of the overlying conductive region, an inspection is made to determine the concentration of small particles. A variety of methods are available for observing the morphology of the surface and thus determining the concentration of such particles and/or a parameter indicative of such concentration. Methods based on observation using electromagnetic radiation (e.g. white light, infrared light, x-rays) or particles such as electrons or ions are employable. Exemplary inspection methods including optical, infrared, scanning electron and transmission electron microscopy are suitable for observing particle density. Generally, it is desirable that the resolution of the inspection method be at least capable of differentiating defects/particles having dimensions in the range 0.01 to 100 $\mu m$. Poorer resolution tends to make adequate determination of particle density difficult. In observing the morphology of the surface, a small particle is one having a surface area greater than 0.01 $\mu m^2$ but less than 7 $\mu m^2$. The surface area of a particle is that surrounded by a boundary region between regions having different absorption transmission or scattering properties relative to incident electromagnetic radiation. Such differences result in a contrast in the intensity of the incident or secondary electromagnetic radiation or particles that are absorbed, transmitted, or scattered at the boundary. The actual number of small particles per se need not be determined. It is sufficient that a parameter is determined that is indicative of the number of small particles present in any region. Such determination is, for purposes of the invention, considered measuring the small particle density even though the actual number of particles is not specifically counted.

The density of small particles is determinable by a number of techniques. An exemplary technique used for purposes of the invention relative to a pad of more than 10,000 $\mu m^2$ area involves superimposing onto the pad surface, 2, a boundary (7 in FIG. 1) that encompasses an area of 10,000 $\mu m^2$. (For the inspection purposes the surface is not physically changed but is merely conceptually parsed into such regions. Boundary region 7 in one embodiment is a square with an area of 10,000 $\mu m^2$. The region shape is, however, not fixed and the criterion is satisfied if a region of 10,000 $\mu m^2$ of any shape encompasses an excessive number of particles anywhere on the pad.) The 10,000 $\mu m^2$ region is moved over the pad including, for example, to position 5 in FIG. 1 and position 9 shown by dotted lines) and the largest number of particles that are encompassable irrespective of orientation of such boundary is determined. The boundary region is placed over different regions of the pad such that the entire pad is evaluated. The pad boundaries are delineated by the edge where the ENIG layers and either dielectric and/or non-ENIG coated metal intersect.

Figure 2:
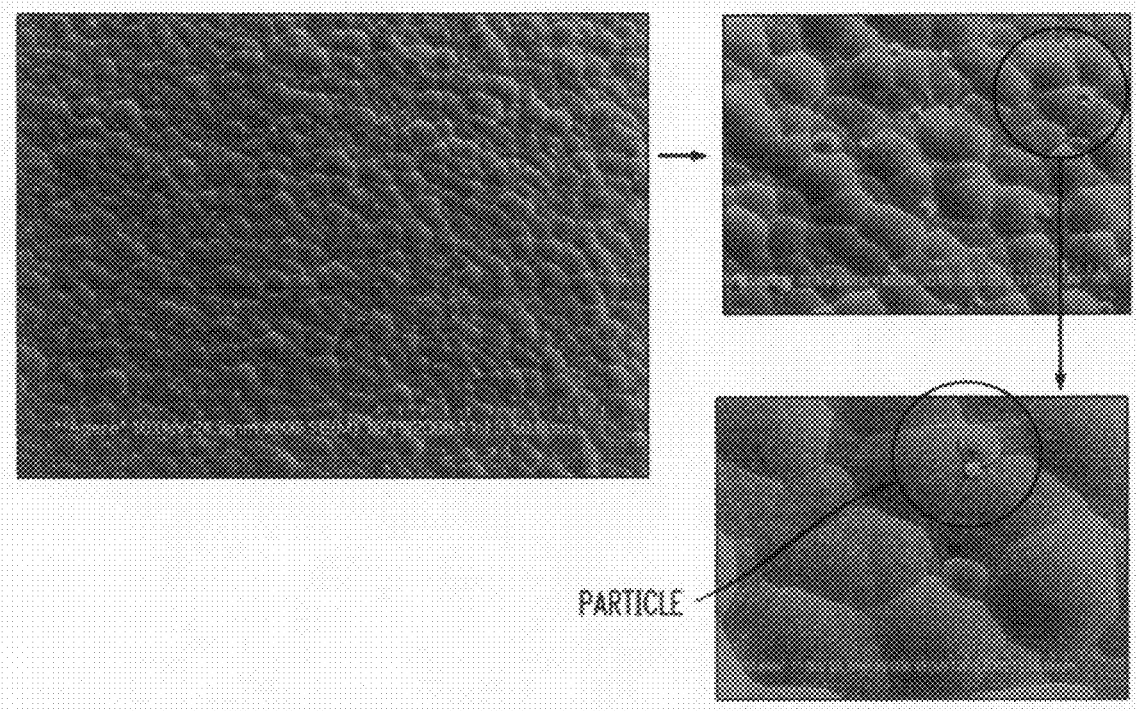
FIGS. 2 and 3 are micrographs showing a representative nickel plated pad surface exhibiting unacceptable small particle density.
Figure 3:
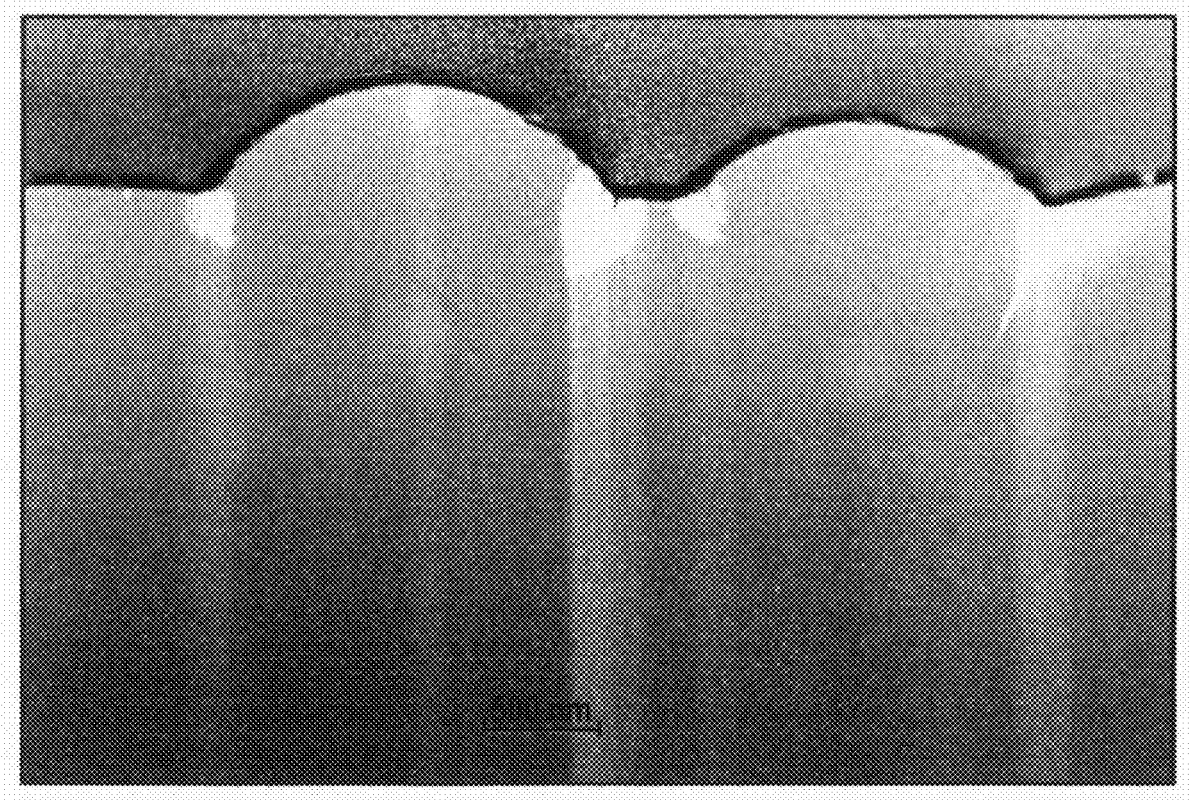

FIGS. 2 and 3 show actual micrographs of a pad region with the pad region shown in FIG. 2 measuring $0.024/\mu m^2$ and having small particles in an unacceptable density. The following example illustrates how such micrographs were obtained:

Example

The substrate upon which the pad shown in FIG. 2 was fabricated had an ENIG surface finish obtained from a commercial substrate supplier (NTK having a United States Administration, Sales and Design Center at 3979 Freedom Circle, Suite 30, Santa Clara, Calif. 95054). The substrate was prepared by NTK's standard process: i) the core of the substrate was a standard, glass fiber filled 0.8 mm thick core metallized with Cu on both sides, ii) vias were mechanically drilled through the core. iii) The vias were then filled with Cu by a standard plating processes. iv) A series of interlayer interconnect structures were then created by lamination of polymers, followed by photo definition of vias, and then deposition of Cu. The final Cu layer was protected with standard solder mask polymer. The solder mask above the Cu pads was patterned by photolithography and etching. The Cu pads were then exposed to a commercially available ENIG bath such as those available from Uyemura located at 3990 Concours, #425, Ontario, Calif. 91764. Subsequently the pads were evaluated using an optical microscope at 50×-100× magnification. This optical inspection revealed small particles on the pads surface. Optical inspection was followed by inspecting the entire pad area with a scanning electron microscope at 1000-5000×. A grid pattern was then superimposed upon the scanning electron micrographs and the particle density was determined by counting the number of particles per square of the grid. In this case the grid was numbered so that each region of the pad could be clearly identified as to its particular particle density.

FIG. 3 is an actual transmission electron micrograph showing a cross-sectional view of a representative nickel plated pad surface through a region exhibiting the undesirable particles. The micrograph shows the resulting nickel layer morphology from particles associated with the black pad issue.

It is possible that some pads of a device have an acceptable small particle density while other pads have an unacceptable density. Generally, if even one pad is unacceptable, such device is considered, in turn, unacceptable. However, in general, a device is considered unacceptable if its intended purpose is precluded by the failure of the pads having unacceptable density.

Inspection is typically done on a representative sample of devices from a manufacturing lot. Generally, it is advantageous to inspect at least 10 percent of the devices within a lot. However, smaller percentages are not precluded and the specific percentage inspected is generally determined by statistical history of device failure. For particularly sensitive applications or devices such as devices for use in medical applications it is often considered desirable to inspect a very high percentage or even all devices within a lot.

Because of the significant economic consequences of fully processing a lot that ultimately develops black pad problems, it is generally considered advantageous when an unacceptable small particle density is detected in an excessive number of pads to either discard the entire lot or perform a process that acceptably mitigates the problems associated with the black pad phenomenon. Economic considerations, however, typically suggest the complete elimination of the lot. If the lot is acceptable, further processing (e.g. procedures such as continued formation of the ENIG structure, soldering, and electrical testing) towards completion of the device is performed.

The invention claimed is:

1. A method of fabricating a plurality of electronic entities having an electroless nickel immersion/gold (ENIG) structure, said method comprising the steps of:
   forming a first electrically conducting region overlying a substrate;
   forming a second region comprising nickel overlying said first electrically conducting region;
   determining the small particle density for a predetermined area of the surface of said second region for at least one of said electronic entities of said plurality, by analyzing said surface: and
   continuing toward completion of at least some of said electronic entities of said plurality if said small particle density of said predetermined area, for said at least one of said electronic entities, is not greater than a maximum acceptable value for said small particle density, said continuing toward completion including forming a third region overlying said second region, said third region comprising a further metal that is higher on the electromotive force (EMF) scale than nickel.

2. The method of claim 1, wherein said analyzing comprises inspecting by use of scanning electron microscopy.

3. The method of claim 1, wherein said analyzing comprises inspecting by use of optical spectroscopy.

4. The method of claim 3, wherein said optical spectroscopy comprises infrared spectroscopy.

5. The method of claim 1, wherein said further metal comprises gold.

6. The method of claim 1, wherein said further metal comprises palladium.

7. The method of claim 1, wherein said continuing toward completion comprises making a solder connection at said ENIG structure.

8. The method of claim 1, wherein said continuing toward completion is performed on all of said electronic entities of said plurality.

9. The method of claim 1, wherein said determining the small particle density is performed on at least 10% of said electronic entities of said plurality.

10. The method of claim 9, wherein said determining the small particle density is performed on each of said electronic entities of said plurality.

11. The method of claim 1, wherein said determining the small particle density includes defining a small particle as a particle having a surface area of less than approximately 7 $\mu m^2$.

12. The method of claim 1, wherein said ENIG structure includes an electroless nickel/electroless palladium/immersion gold (ENEPIG) structure.

13. The method of claim 1, wherein said maximum acceptable value for said small particle density is more than 10 small particles for any 10,000 $\mu m^2$ pad region.

14. The method of claim 13, wherein a small particle is a particle having a surface area of less than approximately 7 $\mu m^2$.

* * * * *